(12) United States Patent
Matsumura et al.

(10) Patent No.: US 11,070,239 B2
(45) Date of Patent: Jul. 20, 2021

(54) INTERFACE CIRCUIT AND COMMUNICATION APPARATUS

(71) Applicant: Murata Manufacturing Co., Ltd., Kyoto (JP)

(72) Inventors: Toshiki Matsumura, Kyoto (JP); Yuji Shintomi, Kyoto (JP); Satoshi Matsumura, Kyoto (JP); Kazuhiro Nakamuta, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/711,685

(22) Filed: Dec. 12, 2019

(65) Prior Publication Data

US 2020/0195281 A1 Jun. 18, 2020

(30) Foreign Application Priority Data

Dec. 13, 2018 (JP) .............................. JP2018-233833
Sep. 19, 2019 (JP) .............................. JP2019-170793

(51) Int. Cl.
*H04B 1/04* (2006.01)
*H04B 1/00* (2006.01)
*H03F 3/195* (2006.01)

(52) U.S. Cl.
CPC ........... *H04B 1/0007* (2013.01); *H03F 3/195* (2013.01); *H03F 2200/451* (2013.01)

(58) Field of Classification Search
CPC .... H03F 2200/451; H03F 3/195; H03M 1/00; H04B 1/0007; H04B 1/04; H04B 2001/0408
See application file for complete search history.

(56) References Cited

U.S. PATENT DOCUMENTS

| 4,562,545 A * | 12/1985 | Hasegawa ............. F02P 5/1502 |
| | | 701/115 |
| 8,526,995 B2 | 9/2013 | Ripley et al. |
| 2013/0077544 A1 | 3/2013 | Gomez et al. |
| 2018/0123621 A1 | 5/2018 | Lin et al. |

FOREIGN PATENT DOCUMENTS

| TW | 201315166 A1 | 4/2013 |
| TW | 201817176 A | 5/2018 |

* cited by examiner

*Primary Examiner* — David S Huang
(74) *Attorney, Agent, or Firm* — Pearne & Gordon LLP

(57) ABSTRACT

An interface circuit and a communication apparatus that can reduce the circuit scale and power consumption are provided. An interface circuit includes a plurality of communication devices, an analog-to-digital (AD) conversion circuit that converts an analog signal to digital data, and a control circuit that reads the digital data in response to read-request signals received from the plurality of communication devices.

6 Claims, 18 Drawing Sheets

FIG. 16

| tkick_1 | catch_1 | tkick_2 | catch_2 | data_1 | data_2 |
|---|---|---|---|---|---|
| 1 | 0 | 0 | 0 | ts_data | – |
| 1 | 0 | 0 | 1 | ts_data | ts_data |
| 0 | 0 | 1 | 0 | – | ts_data |
| 0 | 1 | 1 | 0 | ts_data | ts_data |
| 1 | 0 | 1 | 0 | ts_data | ts_data |

FIG. 18

|  | EXAMPLE 1 | EXAMPLE 2 | EXAMPLE 3 | EXAMPLE 4 | EXAMPLE 5 |
|---|---|---|---|---|---|
| tkick_1 | 1 | 0 | 0 | 0 | 0 |
| catch_1 | 0 | 1 | 0 | 1 | 0 |
| tkick_2 | 0 | 0 | 1 | 0 | 0 |
| catch_2 | 0 | 0 | 0 | 1 | 0 |
| tkick_3 | 0 | 0 | 0 | 0 | 1 |
| catch_3 | 0 | 0 | 1 | 0 | 0 |
| tkick_4 | 0 | 1 | 0 | 0 | 0 |
| catch_4 | 0 | 0 | 0 | 0 | 0 |
| tkick_5 | 0 | 0 | 0 | 1 | 0 |
| catch_5 | 1 | 0 | 1 | 0 | 0 |
| tkick_6 | 0 | 0 | 0 | 0 | 1 |
| catch_6 | 0 | 1 | 0 | 1 | 0 |
| data_1 | ts_data | ts_data | – | ts_data | – |
| data_2 | – | – | ts_data | ts_data | – |
| data_3 | – | – | ts_data | – | ts_data |
| data_4 | – | ts_data | – | – | – |
| data_5 | ts_data | – | ts_data | ts_data | – |
| data_6 | – | ts_data | – | ts_data | ts_data |

# INTERFACE CIRCUIT AND COMMUNICATION APPARATUS

This application claims priority from Japanese Patent Application No. 2018-233833 filed on Dec. 13, 2018 and Japanese Patent Application No. 2019-170793 filed on Sep. 19, 2019. The content of these applications are incorporated herein by reference in their entireties.

BACKGROUND

The present disclosure relates to an interface circuit and a communication apparatus.

Recent mobile communication terminals, such as cellular phones and smartphones, are required to achieve multiband or multimode communication, in which a single terminal is capable of communicating by using a plurality of frequencies or a plurality of wireless communication schemes. Such communication apparatuses as are capable of multiband or multimode communication are required to process a plurality of transmit/receive signals at high speed without necessarily degrading quality. For example, Licensed-Assisted Access (LAA) has been standardized. This technology uses the unlicensed 5 GHz band, which is used for a wireless local area network (LAN), as a secondary cell for carrier aggregation (CA) in the Long Term Evolution-Advanced (LTE-Advanced) technology to improve throughput.

A communication apparatus typically has a configuration to monitor a temperature and compensate for a temperature change to stabilize gain. For example, a configuration is disclosed to convert an analog signal received from a temperature sensor to a digital output, which is input to a system (for example, refer to U.S. Pat. No. 8,526,995).

BRIEF SUMMARY

In a configuration that includes, for example, communication devices for a wireless LAN and for LTE communication, if a temperature sensor and an analog-to-digital (AD) conversion circuit are disposed for each communication device, an issue of increased circuit scale and increased power consumption arises.

Accordingly, the present disclosure provides an interface circuit and a communication apparatus that can reduce the circuit scale and power consumption.

An interface circuit according to an aspect of the present disclosure includes a plurality of communication devices, an AD conversion circuit that converts an analog signal to digital data, and a control circuit that reads the digital data in response to read-request signals received from the plurality of communication devices.

In this configuration, the plurality of communication devices share the use of the AD conversion circuit. Accordingly, the circuit scale and power consumption of the interface circuit can be reduced.

A communication apparatus according to an aspect of the present disclosure includes the interface circuit described above, a power amplifier circuit that amplifies a radio frequency signal, and a sensor that detects a temperature of the power amplifier circuit and that outputs the detected value as the analog signal.

In this configuration, the plurality of communication devices share the use of the AD conversion circuit, and thus the circuit scale and power consumption of the communication apparatus can be reduced.

According to embodiments of the present disclosure, there are provided an interface circuit and a communication apparatus that can reduce the circuit scale and power consumption.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIG. 16 depicts destinations to which digital data is output in the example operations depicted in FIGS. 8 to 15;

FIG. 18 depicts example destinations to which digital data is output in the example configuration depicted in FIG. 17.

DETAILED DESCRIPTION

Hereinafter, an interface circuit and a communication apparatus according to embodiments will be described in detail with reference to the drawings. It is to be noted that the present disclosure is not limited to the embodiments. Obviously, the embodiments are described for illustrative purposes and partial substitutions or combinations of configurations illustrated in different embodiments are feasible."

Features common to a first embodiment will not be described and only different features will be described in an embodiment subsequent to the first embodiment. In particular, similar operations and similar advantages achievable by similar configurations will not individually be described in each of the embodiments.

First Embodiment

Figure 1:
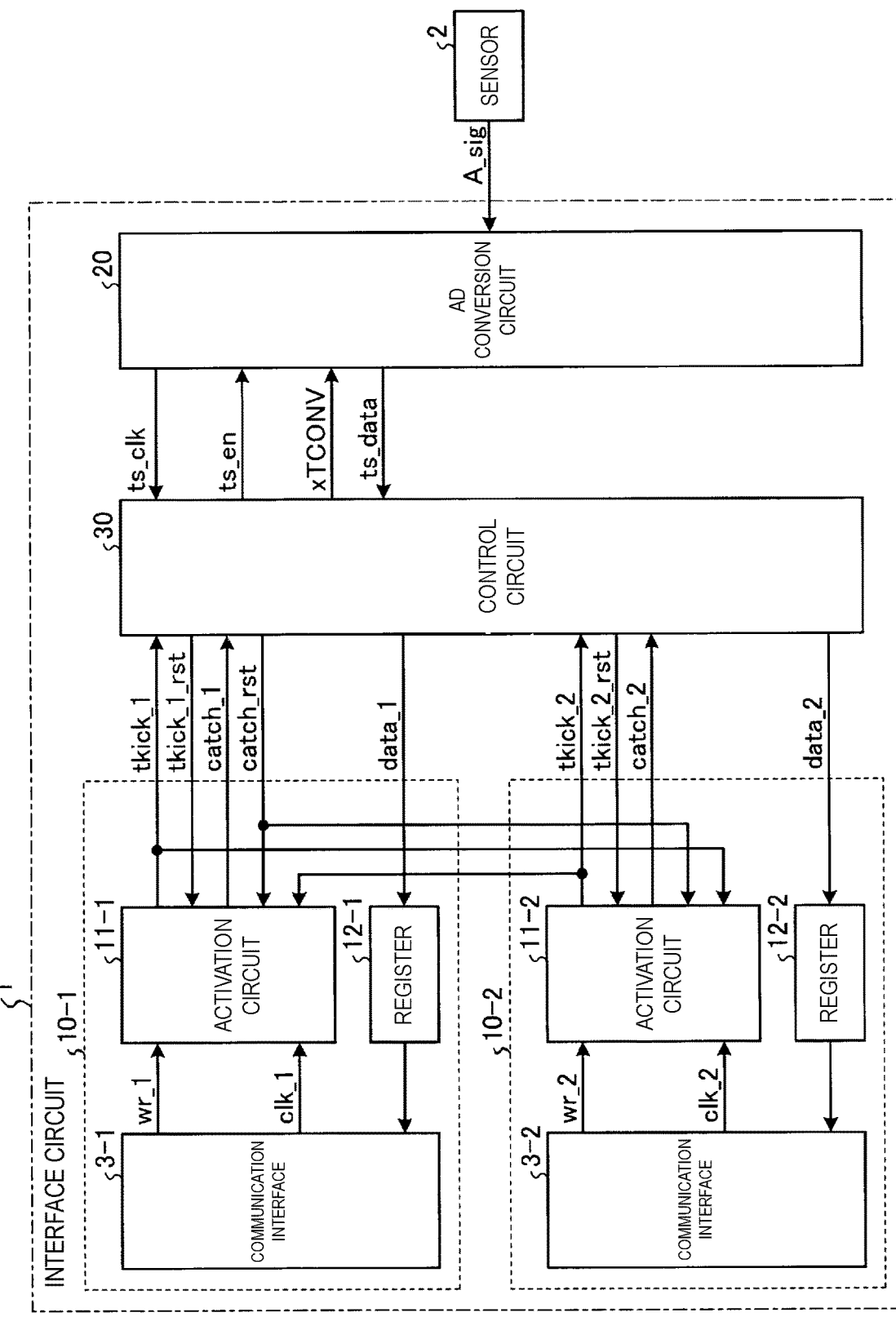
FIG. 1 is a block diagram depicting an example of a schematic configuration of an interface circuit according to an embodiment.
Figure 2:
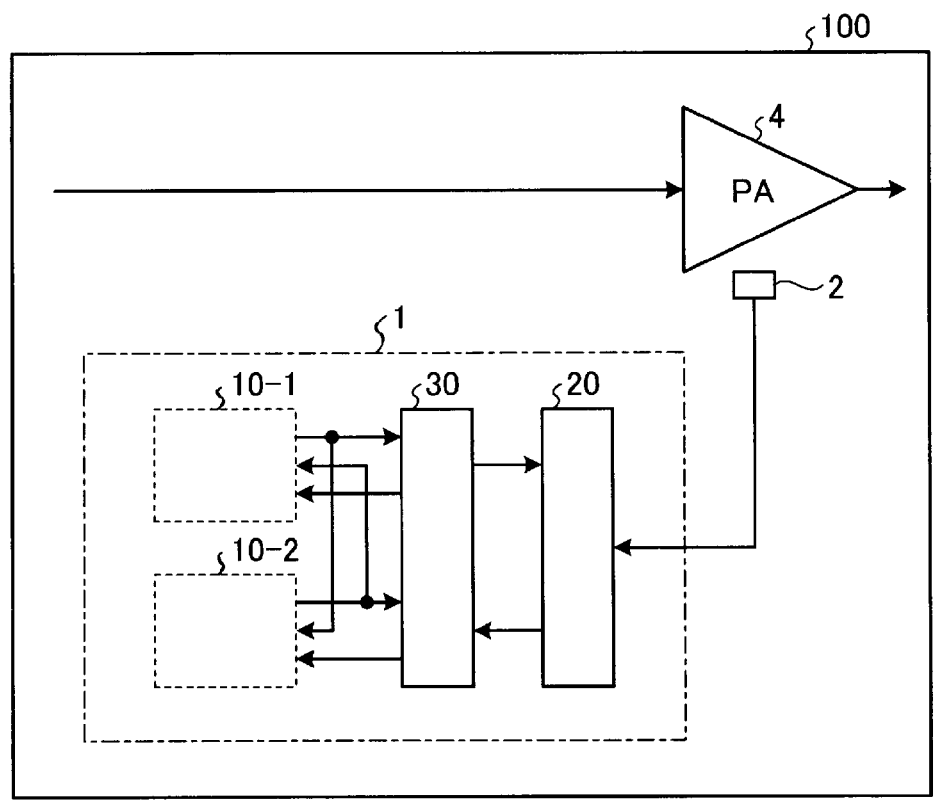
FIG. 2 depicts an example of major components of a communication apparatus according to the embodiment.

FIG. 1 is a block diagram depicting an example of a schematic configuration of an interface circuit according to an embodiment. FIG. 2 depicts an example of major components of a communication apparatus according to the embodiment. As depicted in FIG. 1, an interface circuit 1 includes communication devices 10-1 and 10-2, an analog-to-digital (AD) conversion circuit 20, and a control circuit 30. In this disclosure, the communication device 10-1 is, for example, a communication device used for 5 GHz band Long Term Evolution (LTE) communication, and the communication device 10-2 is, for example, a communication device for Wi-Fi communication. In this disclosure, the AD conversion circuit 20 converts an analog signal A_sig received from a sensor 2 to digital data ts_data. In the configuration according to this disclosure, the two communication devices 10-1 and 10-2 share the use of the sensor 2 and the AD conversion circuit 20. In the following description, the two communication devices 10-1 and 10-2 and the elements thereof are the same, and thus "–1", "–2", "1", and "2" are not appended to the numerals or symbols to represent the two communication devices 10-1 and 10-2 and the elements thereof when each communication device or an element thereof needs not individually be referred to.

When the interface circuit 1 according to the embodiment is applied to a communication apparatus 100, for example, a temperature sensor that detects the temperature of a power amplifier (PA) circuit 4 for radio frequency amplification is adopted as the sensor 2, as depicted in FIG. 2. However, this is not meant to be limiting, and a sensor such as an ultrasonic sensor, an infrared sensor, or a shock sensor may be adopted. Further, the sensor 2 may be any analog circuit including a voltmeter and an ammeter.

The communication device 10 outputs a read-request signal to read the digital data ts_data, which is converted from the analog signal A_sig, which is a value detected by the sensor 2.

The control circuit 30 reads the digital data ts_data from the AD conversion circuit 20 in response to read-request signals (an activation signal tkick and a capture signal catch, which are described below) that are output from the communication device 10. Then, the control circuit 30 outputs the digital data ts_data to the communication device 10.

As depicted in FIG. 1, the communication device 10-1 includes a communication interface 3-1, an activation circuit 11-1, and a register 12-1. The communication device 10-2 includes a communication interface 3-2, an activation circuit 11-2, and a register 12-2.

In this disclosure, the communication interface 3-1 is a serial communication interface of the communication device 10-1, which is used, for example, for 5 GHz band LTE communication, and the communication interface 3-2 is a serial communication interface of the communication device 10-2, which is used, for example, for Wi-Fi communication.

The communication interface 3-1 outputs to the activation circuit 11-1 a read command wr_1 and a communication clock signal clk_1, the read command wr_1 being output to read the digital data ts_data. The communication interface 3-2 outputs to the activation circuit 11-2 a read command wr_2 and a communication clock signal clk_2, the read command wr_2 being output to read the digital data ts_data. In this disclosure, the communication clock signal clk_1 and the communication clock signal clk_2 are asynchronous with each other. Alternatively, the communication clock signal clk_1 and the communication clock signal clk_2 may be synchronous with each other.

The activation circuit 11-1 receives the read command wr_1 from the communication interface 3-1 and generates and outputs in response to the read command wr_1 an activation signal tkick_1 to generate an enable signal ts_en described below. The enable signal ts_en is a signal that is output from the control circuit 30 to activate the AD conversion circuit 20. The activation signal tkick_1 is output to the control circuit 30 and the activation circuit 11-2.

The activation circuit 11-2 receives the read command wr_2 from the communication interface 3-2 and generates and outputs in response to the read command wr_2 an activation signal tkick_2 to generate the enable signal ts_en. The activation signal tkick_2 is output to the control circuit 30 and the activation circuit 11-1.

Further, if the data values of the read command wr_1 received from the communication interface 3-1 and the activation signal tkick_2 received from the activation circuit 11-2 are "1", the activation circuit 11-1 does not generate or output the activation signal tkick_1. Instead, the activation circuit 11-1 generates and outputs a capture signal catch_1 to capture the digital data ts_data from the AD conversion circuit 20. The capture signal catch_1 is output to the control circuit 30.

Further, if the data values of the read command wr_2 received from the communication interface 3-2 and the activation signal tkick_1 received from the activation circuit 11-1 are "1", the activation circuit 11-2 does not generate or output the activation signal tkick_2. Instead, the activation circuit 11-2 generates and outputs a capture signal catch_2 to capture the digital data ts_data from the AD conversion circuit 20. The capture signal catch_2 is output to the control circuit 30.

The control circuit 30 controls the AD conversion circuit 20 in response to the activation signal tkick_1 and the capture signal catch_1, which are read-request signals received from the activation circuit 11-1, and in response to the activation signal tkick_2 and the capture signal catch_2, which are read-request signals received from the activation circuit 11-2. Further, the control circuit 30 outputs the digital data ts_data, which has been converted from an analog signal by the AD conversion circuit 20, to the register 12-1 as capture data data_1. Further, the control circuit 30 outputs the digital data ts_data, which has been converted from an analog signal by the AD conversion circuit 20, to the register 12-2 as capture data data_2.

The register 12-1 outputs the capture data data_1, which is received from the control circuit 30, to the communication interface 3-1.

The register 12-2 outputs the capture data data_2, which is received from the control circuit 30, to the communication interface 3-2.

Figure 3:
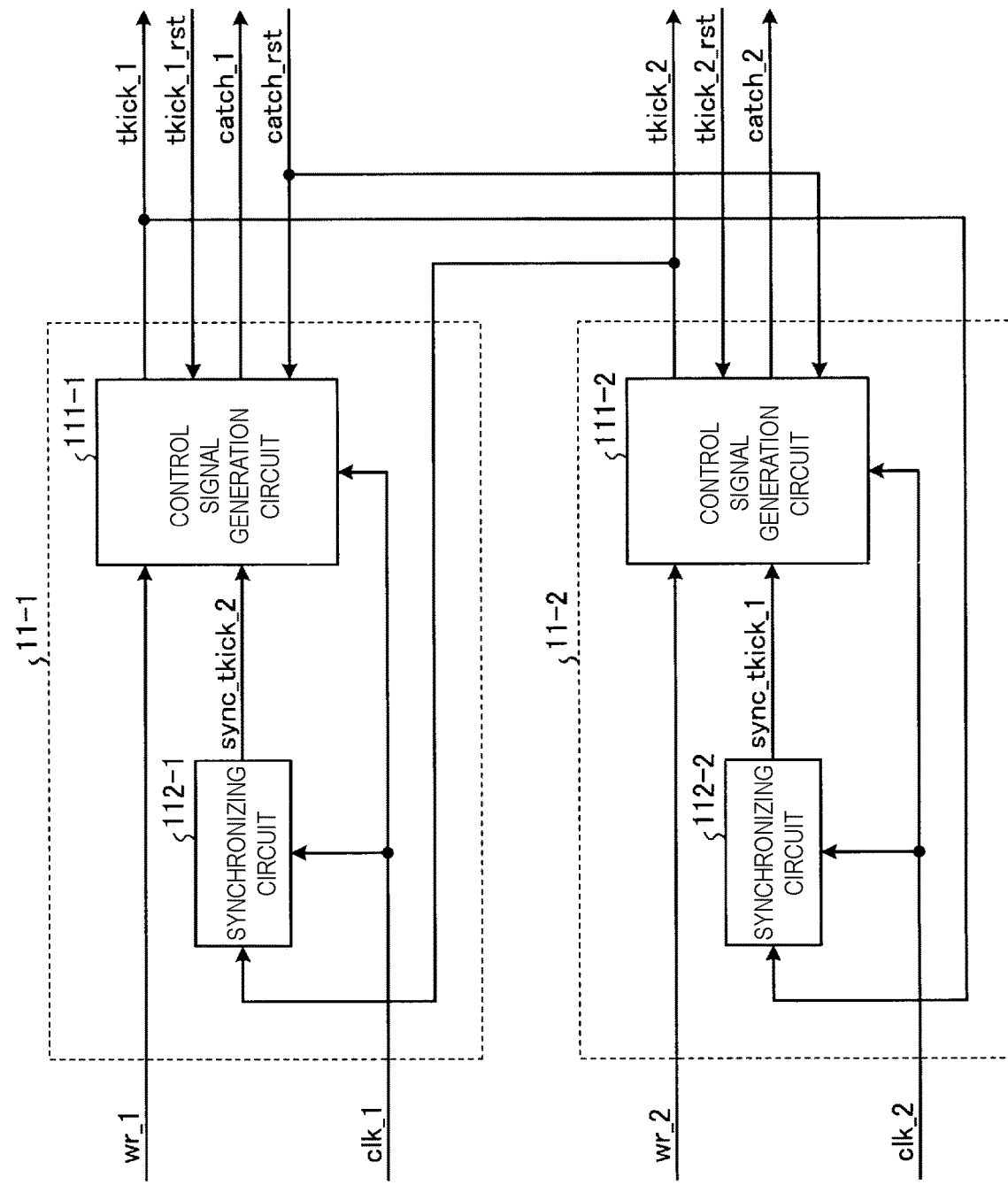
FIG. 3 is a block diagram depicting an example of internal configurations of activation circuits.
Figure 4:
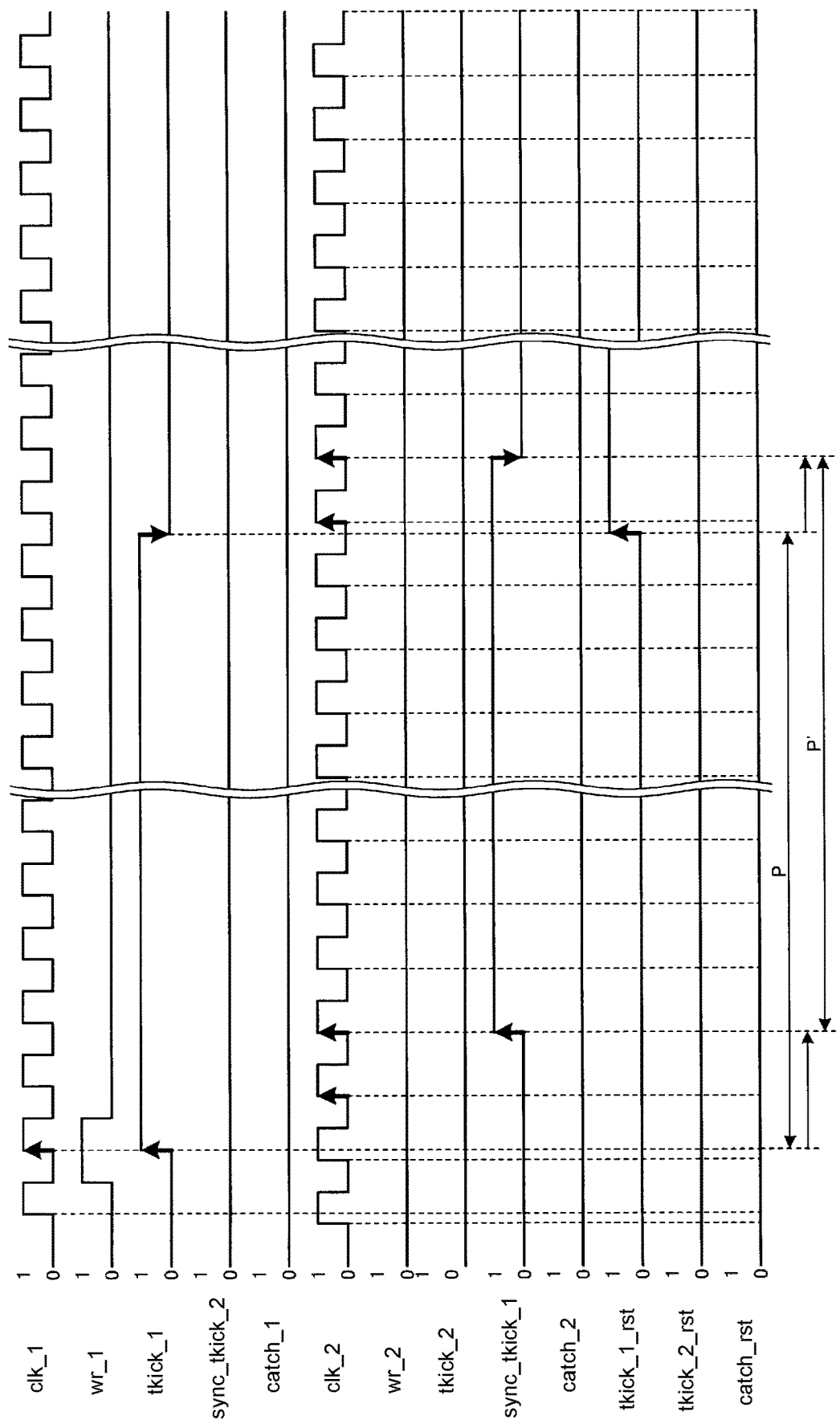
FIG. 4 is a timing chart depicting a first example of the basic operation of the activation circuits.
Figure 5:
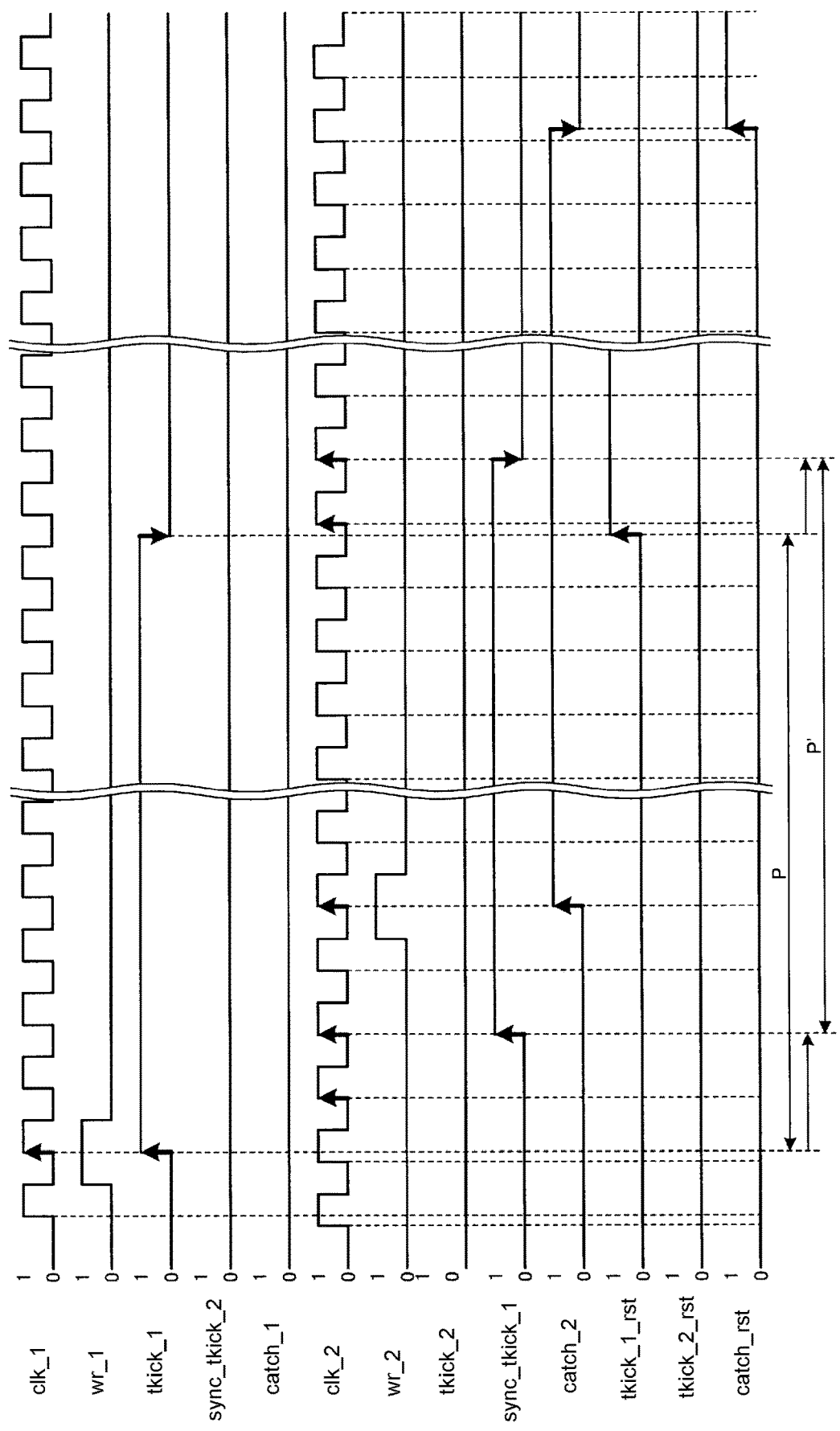
FIG. 5 is a timing chart depicting a second example of the basic operation of the activation circuits.
Figure 6:
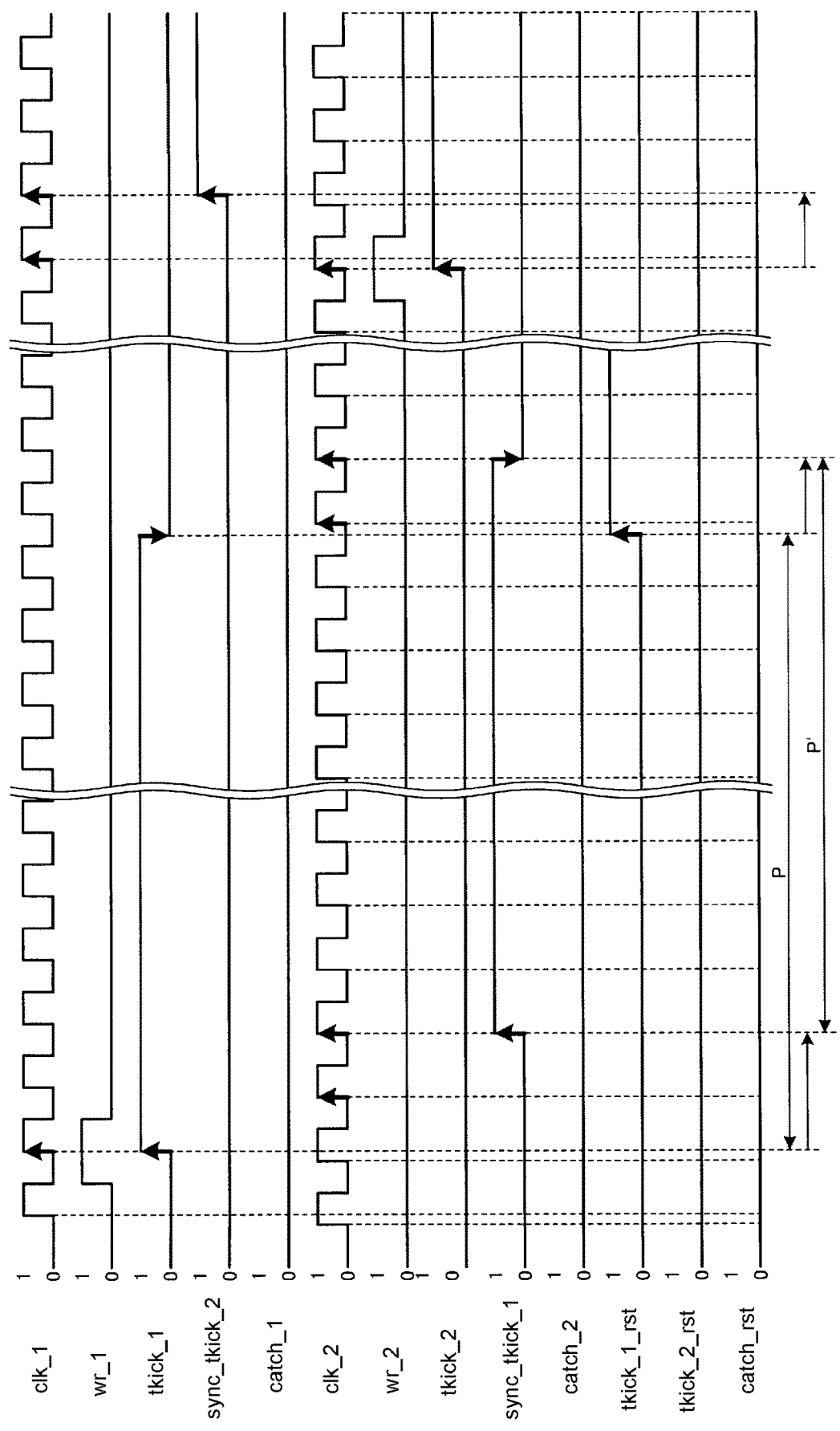
FIG. 6 is a timing chart depicting a third example of the basic operation of the activation circuits.
Figure 7:
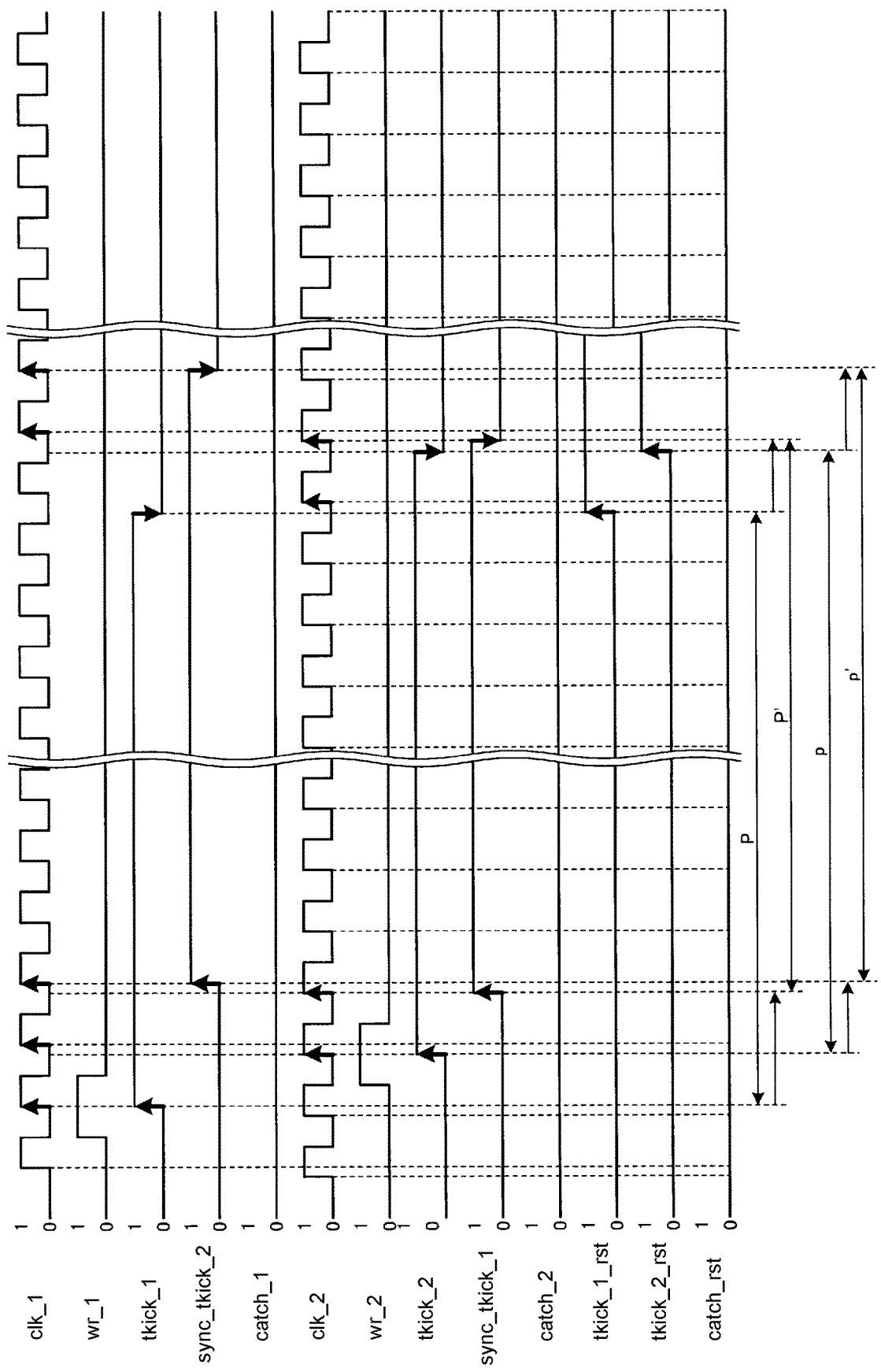
FIG. 7 is a timing chart depicting a fourth example of the basic operation of the activation circuits.

Next, the basic operation of the activation circuit 11-1 and the activation circuit 11-2 will be described. FIG. 3 is a block diagram depicting an example of internal configurations of the activation circuit 11-1 and the activation circuit 11-2. FIG. 4 is a timing chart depicting a first example of the basic operation of the activation circuit 11-1 and the activation circuit 11-2. FIG. 5 is a timing chart depicting a second example of the basic operation of the activation circuit 11-1 and the activation circuit 11-2. FIG. 6 is a timing chart depicting a third example of the basic operation of the activation circuit 11-1 and the activation circuit 11-2. FIG. 7 is a timing chart depicting a fourth example of the basic operation of the activation circuit 11-1 and the activation circuit 11-2. FIG. 4 depicts an example in which the read command wr_1 is output from the communication interface 3-1. FIG. 5 depicts an example in which the read command wr_2 is output from the communication interface 3-2 during a predetermined period P' after the read command wr_1 is output from the communication interface 3-1. FIG. 6 depicts an example in which the read command wr_2 is output from the communication interface 3-2 after the predetermined period P' is over. FIG. 7 depicts an example in which the read command wr_2 is output from the communication interface 3-2 during a two-cycle period of the communication clock signal clk_2 after the read command wr_1 is output from the communication interface 3-1.

As depicted in FIG. 4, a control signal generation circuit 111-1 of the activation circuit 11-1 sets the data value of the activation signal tkick_1 to "1" in synchronization with the first rising edge of the communication clock signal clk_1 after the read command wr_1 is received from the communication interface 3-1.

A synchronizing circuit 112-2 of the activation circuit 11-2 sets the data value of an activation synchronizing signal sync_tkick_1 to "1" in synchronization with the second rising edge of the communication clock signal clk_2 after the rising edge of the activation signal tkick_1.

After a predetermined period P elapses, the control signal generation circuit 111-1 sets the data value of the activation signal tkick_1 to "0" in synchronization with the rising edge of an activation reset signal tkick_1_rst that is output from the control circuit 30.

The synchronizing circuit 112-2 sets the data value of the activation synchronizing signal sync_tkick_1 to "0" in synchronization with the second rising edge of the communication clock signal clk_2 after the falling edge of the activation signal tkick_1.

As depicted in FIG. 5, a control signal generation circuit 111-2 of the activation circuit 11-2 sets the data value of the capture signal catch_2 to "1" in synchronization with the first rising edge of the communication clock signal clk_2 after the read command wr_2 is received from the communication interface 3-2 in the predetermined period P' during which the data value of the activation synchronizing signal sync_tkick_1 is "1". Subsequently, the control signal generation circuit 111-2 sets the data value of the capture signal catch_2 to "0" in synchronization with the rising edge of a capture reset signal catch_rst that is output from the control circuit 30.

Further, as depicted in FIG. 6, the control signal generation circuit 111-2 sets the data value of the activation signal tkick_2 to "1" in synchronization with the first rising edge of the communication clock signal clk_2 after the read command wr_2 is received from the communication interface 3-2 during a period included neither in the predetermined period P during which the data value of the activation signal tkick_1 is "1" nor in the predetermined period P' during which the data value of the activation synchronizing signal sync_tkick_1 is "1".

In addition, as depicted in FIG. 7, the control signal generation circuit 111-2 sets the data value of the activation signal tkick_2 to "1" in synchronization with the first rising edge of the communication clock signal clk_2 after the read command wr_2 is received from the communication interface 3-2 during a two-cycle period of the communication clock signal clk_2 after the data value of the activation signal tkick_1 becomes "1" and before the data value of the activation synchronizing signal sync_tkick_1 becomes "1". Subsequently, after a predetermined period p elapses, the control signal generation circuit 111-2 sets the data value of the activation signal tkick_2 to "0" in synchronization with the rising edge of an activation reset signal tkick_2_rst that is output from the control circuit 30.

A synchronizing circuit 112-1 sets the data value of an activation synchronizing signal sync_tkick_2 to "0" in synchronization with the second rising edge of the communication clock signal clk_1 after the falling edge of the activation signal tkick_2.

Figure 8:
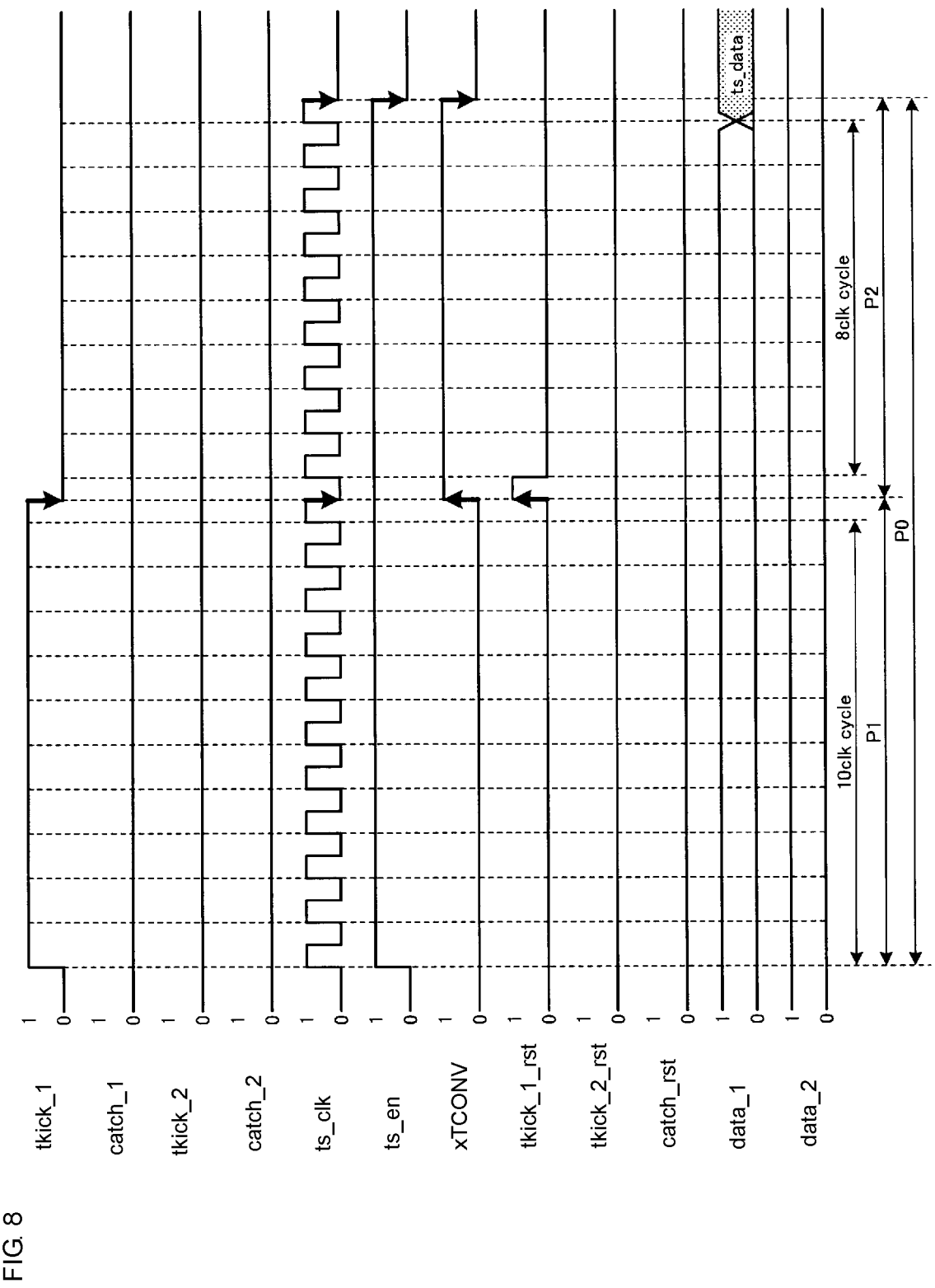
FIG. 8 is a timing chart depicting a first specific example of the operation of the interface circuit according to the embodiment.
Figure 9:
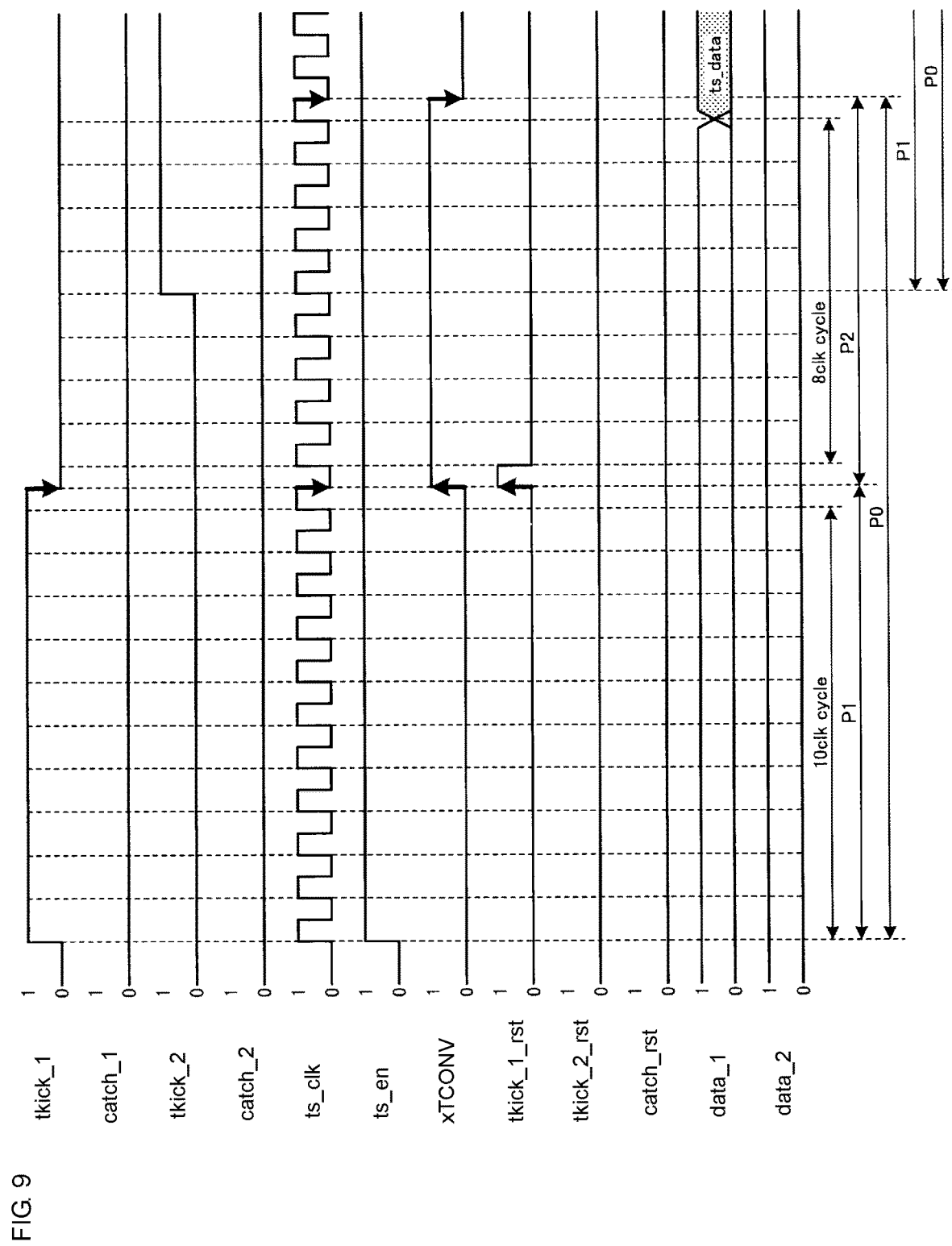
FIG. 9 is a timing chart depicting a second specific example of the operation of the interface circuit according to the embodiment.
Figure 10:
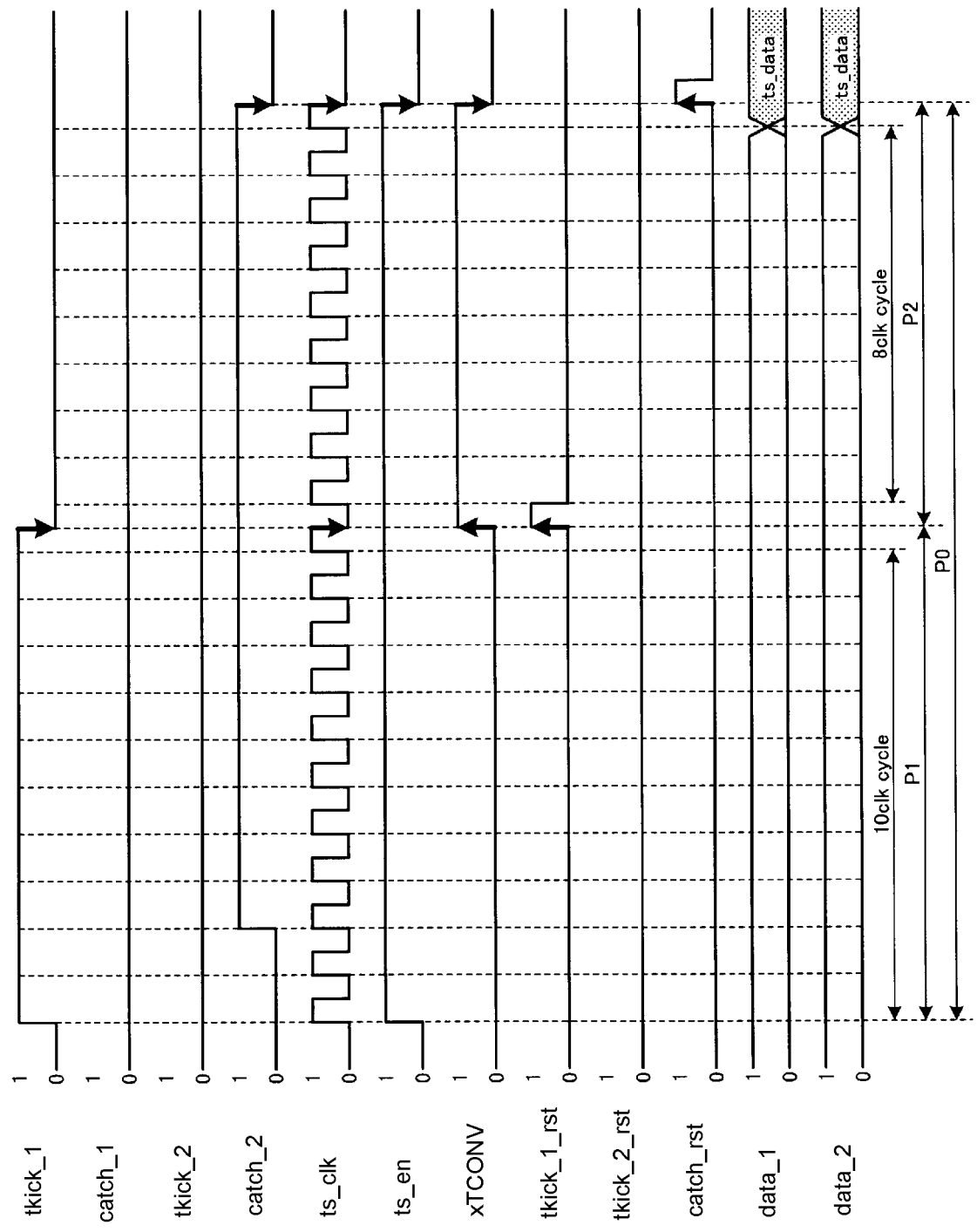
FIG. 10 is a timing chart depicting a third specific example of the operation of the interface circuit according to the embodiment.
Figure 11:
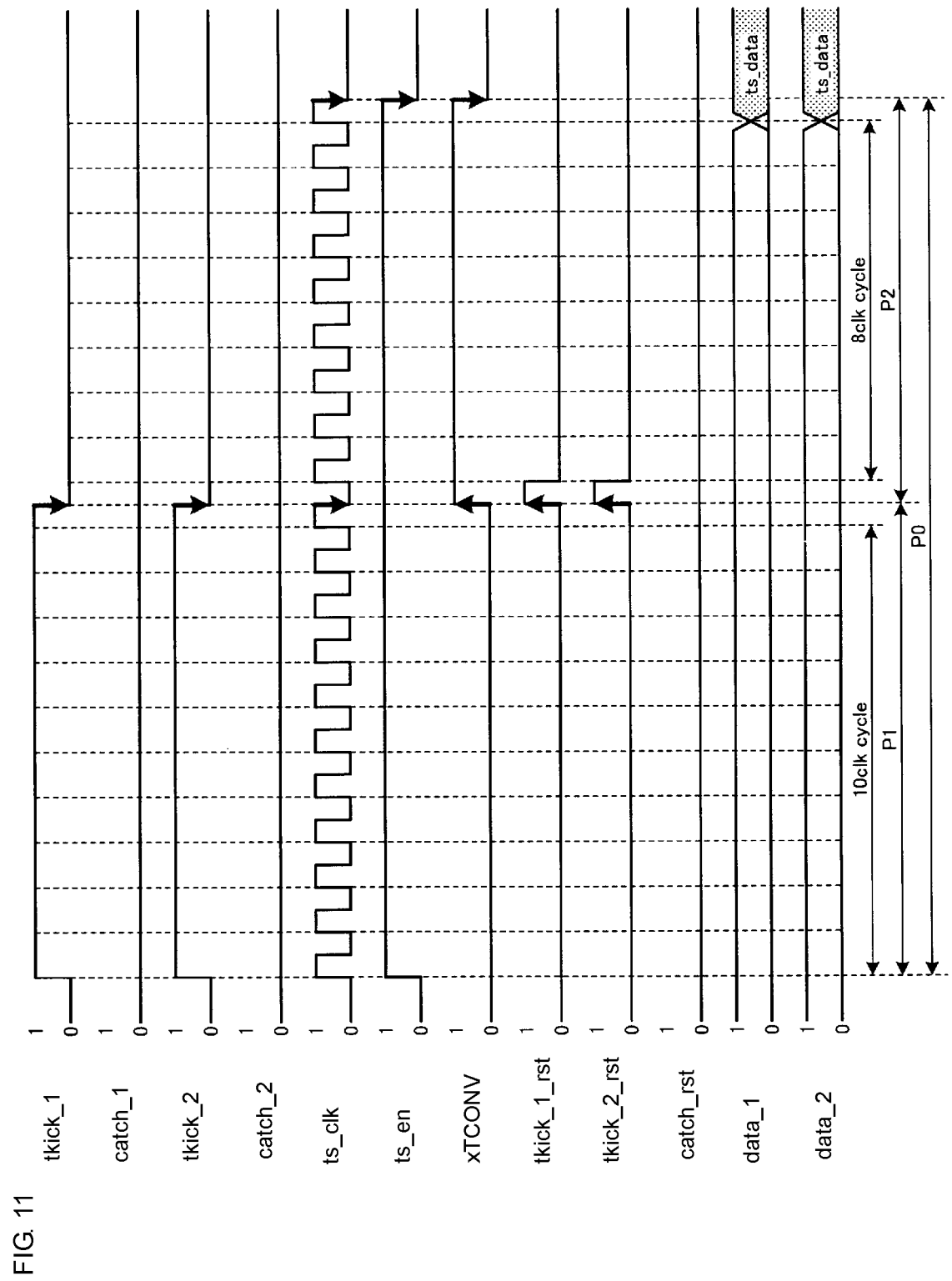
FIG. 11 is a timing chart depicting a fourth specific example of the operation of the interface circuit according to the embodiment.
Figure 12:
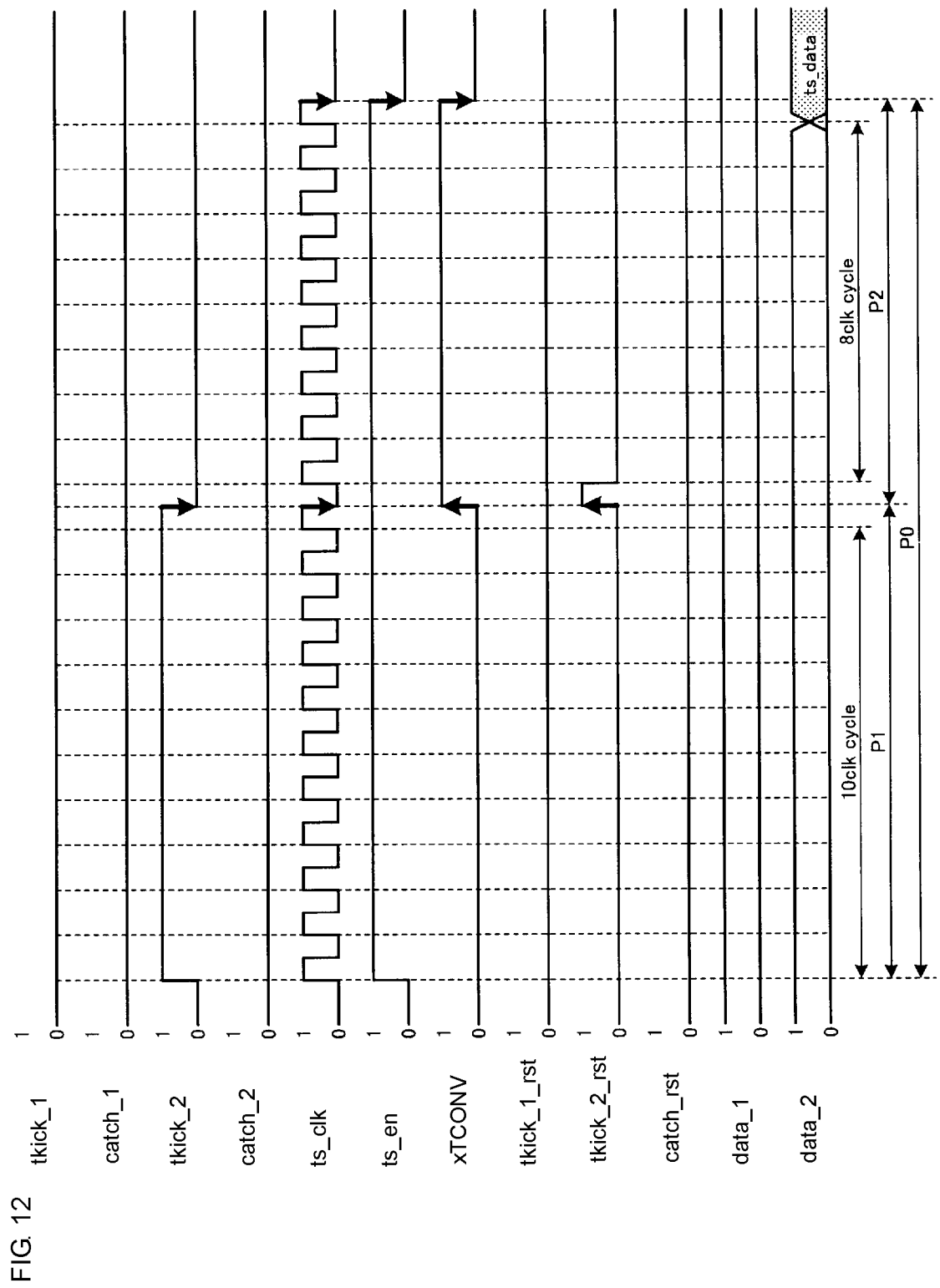
FIG. 12 is a timing chart depicting a fifth specific example of the operation of the interface circuit according to the embodiment.
Figure 13:
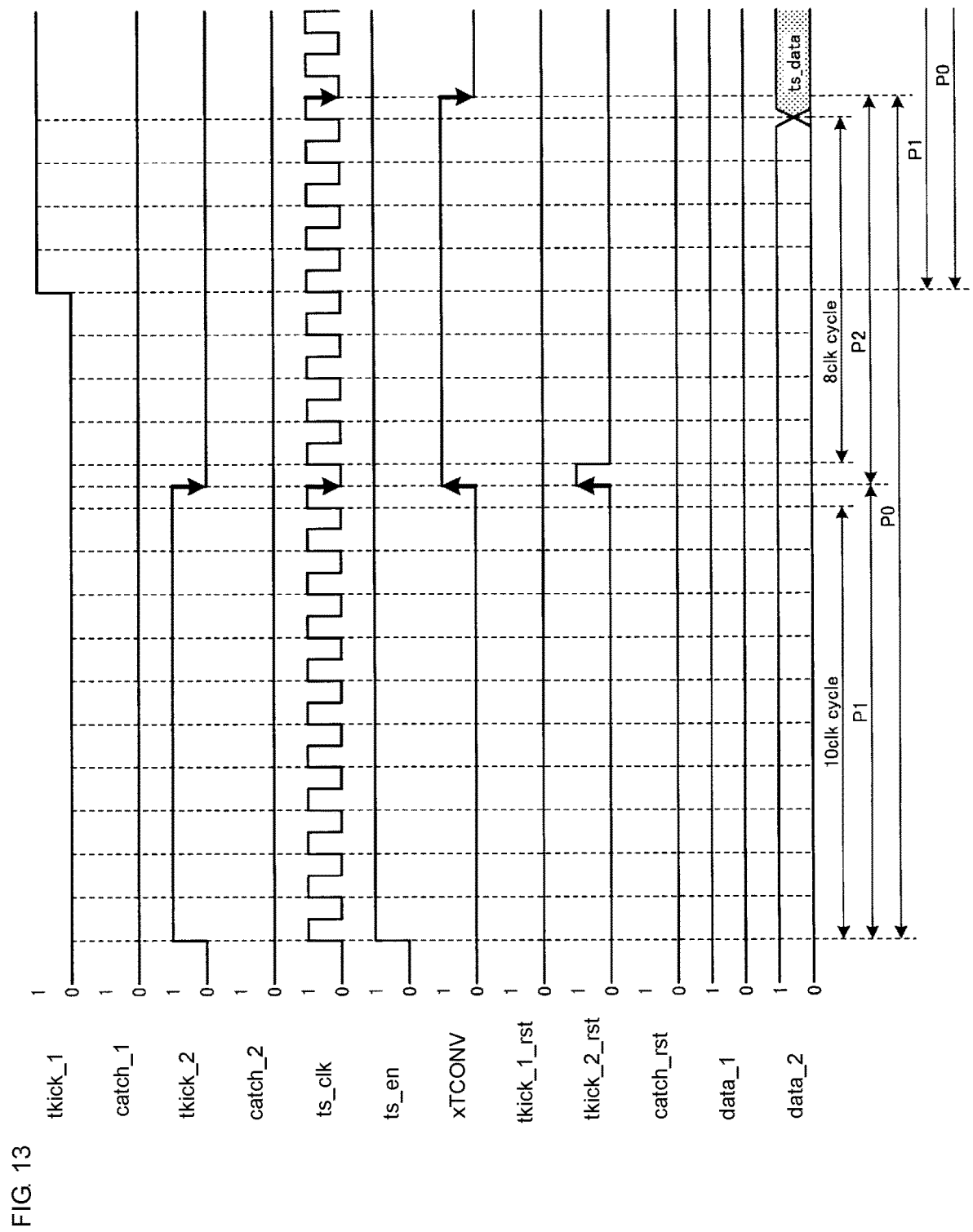
FIG. 13 is a timing chart depicting a sixth specific example of the operation of the interface circuit according to the embodiment.
Figure 14:
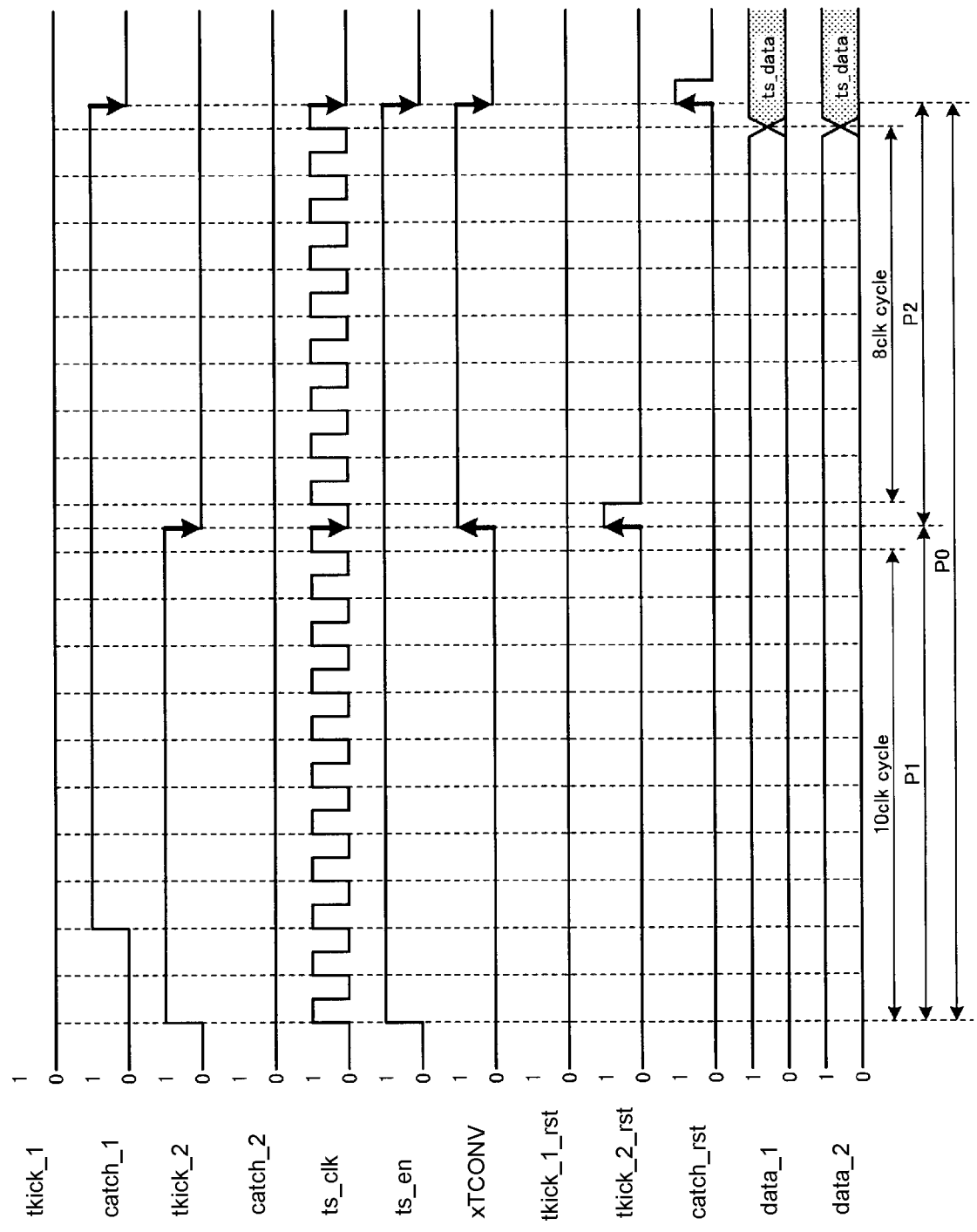
FIG. 14 is a timing chart depicting a seventh specific example of the operation of the interface circuit according to the embodiment.
Figure 15:
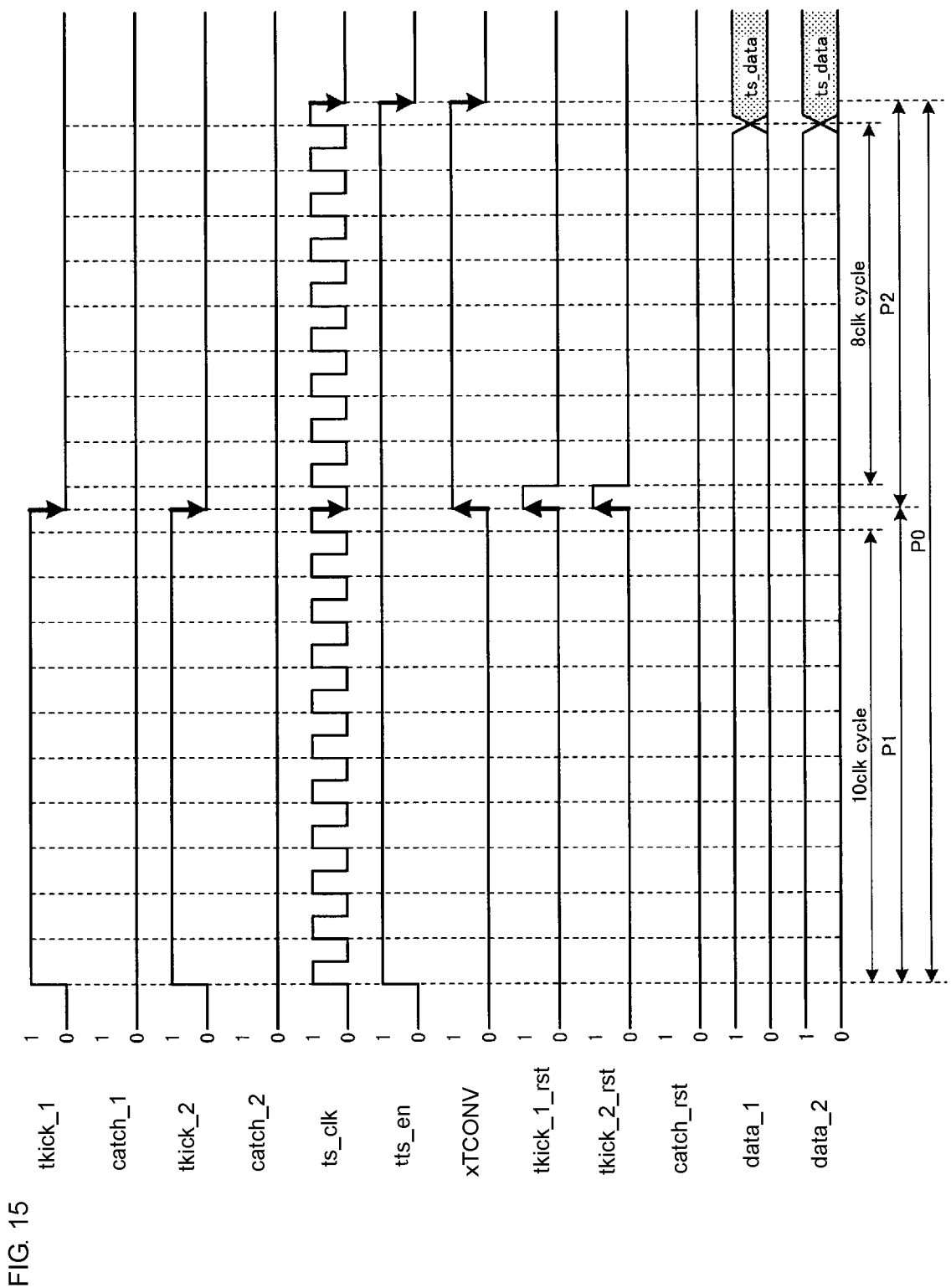
FIG. 15 is a timing chart depicting an eighth specific example of the operation of the interface circuit according to the embodiment.

Next, specific examples of the operation of the interface circuit 1 according to the embodiment will be described. FIG. 8 is a timing chart depicting a first specific example of the operation of the interface circuit 1 according to the embodiment. FIG. 9 is a timing chart depicting a second specific example of the operation of the interface circuit 1 according to the embodiment. FIG. 10 is a timing chart depicting a third specific example of the operation of the interface circuit 1 according to the embodiment. FIG. 11 is a timing chart depicting a fourth specific example of the operation of the interface circuit 1 according to the embodiment. FIG. 12 is a timing chart depicting a fifth specific example of the operation of the interface circuit 1 according to the embodiment. FIG. 13 is a timing chart depicting a sixth specific example of the operation of the interface circuit 1 according to the embodiment. FIG. 14 is a timing chart depicting a seventh specific example of the operation of the interface circuit 1 according to the embodiment. FIG. 15 is a timing chart depicting an eighth specific example of the operation of the interface circuit 1 according to the embodiment. FIG. 8 to FIG. 11, each depicts a chart starting at a point when the read command wr_1 is output from the communication interface 3-1 and the data value of the activation signal tkick_1 becomes "1". FIG. 12 to FIG. 15, each depicts a chart starting at a point when the read command wr_2 is output from the communication interface 3-2 and the data value of the activation signal tkick_2 becomes "1".

In this disclosure, the clock cycle lengths of the communication clock signal clk_1 and the communication clock signal clk_2 are assumed to be sufficiently shorter than the clock cycle length of a sampling clock signal ts_clk of the AD conversion circuit 20. In other words, the predetermined periods P, P', p, and p' depicted in FIG. 4 to FIG. 7 are assumed to be approximately equal to each other. Further, as depicted in FIG. 8 to FIG. 15, in this disclosure, a period including 10 clock cycles of the sampling clock signal ts_clk after the data value of the activation signal tkick_1 or the activation signal tkick_2 becomes "1" is referred to as a "waiting period P1" for the AD conversion circuit 20, a period including eight clock cycles of the sampling clock signal ts_clk after the waiting period P1 is over is referred to as an "AD conversion period P2" for the AD conversion circuit 20, and the sum of the waiting period P1 and the AD conversion period P2 is referred to as an "operation period P0" for the AD conversion circuit 20. The control circuit 30 has a function of counting the sampling clock signal ts_clk of the AD conversion circuit 20. The waiting period P1 corresponds to the predetermined periods P, P', p, and p' depicted in FIG. 4 to FIG. 7.

The number of clock cycles included in the waiting period P1 and the number of clock cycles included in the AD conversion period P2 are chosen as examples and not meant to be limiting. For example, the number of clock cycles included in the waiting period P1 may be the number of clock cycles that provides a period sufficient for AD conversion by the AD conversion circuit 20 to stabilize. In the present embodiment, although an example in which the digital data ts_data in the AD conversion circuit 20 has eight bits is described, if the digital data ts_data in the AD conversion circuit 20 has, for example, 12 bits, the AD conversion period P2 may be configured to include 12 clock cycles of the sampling clock signal ts_clk. The number of clock cycles included in the waiting period P1 and the number of clock cycles included in the AD conversion period P2 are not meant to limit this disclosure.

In the examples depicted in FIG. 8 to FIG. 11, the control circuit 30 starts counting the sampling clock signal ts_clk for the waiting period P1, the AD conversion period P2, and the operation period P0 at a point when the read command wr_1 is output from the communication interface 3-1 and the data value of the activation signal tkick_1, which is output from the activation circuit 11-1, becomes "1". Namely, in the examples depicted in FIG. 8 to FIG. 11, the digital data ts_data, which is obtained by AD conversion, is captured by the register 12-1 as the capture data data_1 in response to the read command wr_1 received from the communication interface 3-1.

At a point when the data value of the activation signal tkick_1 becomes "1", the control circuit 30 causes the AD conversion circuit 20 to start outputting the sampling clock signal ts_clk, sets the data value of the enable signal ts_en to "1", and starts counting the sampling clock signal ts_clk.

When a period of 10 clock cycles of the sampling clock signal ts_clk has elapsed in the waiting period P1, the control circuit 30 sets the data value of an AD conversion command xTCONV to "1" and outputs the activation reset signal tkick_1_rst in synchronization with the falling edge of the sampling clock signal ts_clk. Thus, the data value of the activation signal tkick_1 is reset to "0".

The AD conversion circuit 20 converts the analog signal A_sig received from the sensor 2 to the digital data ts_data during a period of eight clock cycles of the sampling clock signal ts_clk in the AD conversion period P2 that follows the waiting period P1.

When a period of eight clock cycles of the sampling clock signal ts_clk has elapsed in the AD conversion period P2, the control circuit 30 reads the digital data ts_data, which is obtained by AD conversion, from the AD conversion circuit 20 and outputs the digital data ts_data to the register 12-1 as the capture data data_1. In addition, the control circuit 30 sets the data values of the enable signal ts_en and the AD conversion command xTCONV to "0" in synchronization with the falling edge of the sampling clock signal ts_clk.

In the examples depicted in FIG. 8 and FIG. 9, the data value of the activation signal tkick_2, which is output from the activation circuit 11-2, remains "0" during the waiting period P1. Namely, the read command wr_2 is not output from the communication interface 3-2 during the waiting period P1. In this case, the control circuit 30 does not output the digital data ts_data, which is obtained by AD conversion, to the register 12-2.

In the example depicted in FIG. 9, the data value of the activation signal tkick_2, which is output from the activation circuit 11-2, becomes "1" during the AD conversion period P2. Namely, the read command wr_2 is output from the communication interface 3-2 during the AD conversion period P2. In this case, at a point when the data value of the activation signal tkick_2 becomes "1", the control circuit 30 starts counting the sampling clock signal ts_clk to start a period of 10 clock cycles for a new waiting period P1.

Further, the control circuit 30 maintains the data value "1" of the enable signal ts_en in this case.

In the example depicted in FIG. 10, the data value of the capture signal catch_2, which is output from the activation circuit 11-2, becomes "1" during the waiting period P1. Namely, the read command wr_2 is output from the communication interface 3-2 during the waiting period P1. In this case, the control circuit 30 outputs the digital data ts_data, which is obtained by AD conversion, to the register 12-1 as the capture data data_1 and to the register 12-2 as the capture data data_2.

In addition, when a period of eight clock cycles of the sampling clock signal ts_clk has elapsed in the AD conversion period P2, the control circuit 30 sets the data values of the enable signal ts_en and the AD conversion command xTCONV to "0" and outputs the capture reset signal catch_rst in synchronization with the falling edge of the sampling clock signal ts_clk. Thus, the data value of the capture signal catch_2 is reset to "0".

In the example depicted in FIG. 11, the data value of the activation signal tkick_2, which is output from the activation circuit 11-2, becomes "1" at the same time as the data value of the activation signal tkick_1, which is output from the activation circuit 11-1, becomes "1". The data values of the activation signal tkick_1 and the activation signal tkick_2 are assumed to become "1" at the same time if the read command wr_2 is input from the communication interface 3-2 during a two-cycle period of the communication clock signal clk_2 after the data value of the activation signal tkick_1 becomes "1" and before the data value of the activation synchronizing signal sync_tkick_1 becomes "1", as depicted in FIG. 7. In this case, the control circuit 30 outputs the digital data ts_data, which is obtained by AD conversion, to the register 12-1 as the capture data data_1 and to the register 12-2 as the capture data data_2.

In the examples depicted in FIG. 12 to FIG. 15, the control circuit 30 starts counting the sampling clock signal ts_clk for the waiting period P1, the AD conversion period P2, and the operation period P0 at a point when the read command wr_2 is output from the communication interface 3-2 and the data value of the activation signal tkick_2, which is output from the activation circuit 11-2, becomes "1". Namely, in the examples depicted in FIG. 12 to FIG. 15, the digital data ts_data, which is obtained by AD conversion, is captured by the register 12-2 as the capture data data_2 in response to the read command wr_2 received from the communication interface 3-2.

At a point when the data value of the activation signal tkick_2 becomes "1", the control circuit 30 causes the AD conversion circuit 20 to start outputting the sampling clock signal ts_clk, sets the data value of the enable signal ts_en to "1", and starts counting the sampling clock signal ts_clk.

When a period of 10 clock cycles of the sampling clock signal ts_clk has elapsed in the waiting period P1, the control circuit 30 sets the data value of the AD conversion command xTCONV to "1" and outputs the activation reset signal tkick_2_rst in synchronization with the falling edge of the sampling clock signal ts_clk. Thus, the data value of the activation signal tkick_2 is reset to "0".

The AD conversion circuit 20 converts the analog signal A_sig received from the sensor 2 to the digital data ts_data during a period of eight clock cycles of the sampling clock signal ts_clk in the AD conversion period P2 that follows the waiting period P1.

When a period of eight clock cycles of the sampling clock signal ts_clk has elapsed in the AD conversion period P2, the control circuit 30 reads the digital data ts_data, which is obtained by AD conversion, from the AD conversion circuit 20 and outputs the digital data ts_data to the register 12-2 as the capture data data_2. In addition, the control circuit 30 sets the data values of the enable signal ts_en and the AD conversion command xTCONV to "0" in synchronization with the falling edge of the sampling clock signal ts_clk.

In the examples depicted in FIG. 12 and FIG. 13, the data value of the activation signal tkick_1, which is output from the activation circuit 11-1, remains "0" during the waiting period P1. Namely, the read command wr_1 is not output from the communication interface 3-1 during the waiting period P1. In this case, the control circuit 30 does not output the digital data ts_data, which is obtained by AD conversion, to the register 12-1.

In the example depicted in FIG. 13, the data value of the activation signal tkick_1, which is output from the activation circuit 11-1, becomes "1" during the AD conversion period P2. Namely, the read command wr_1 is output from the communication interface 3-1 during the AD conversion period P2. In this case, at a point when the data value of the activation signal tkick_1 becomes "1", the control circuit 30 starts counting the sampling clock signal ts_clk to start a period of 10 clock cycles for a new waiting period P1. Further, the control circuit 30 maintains the data value "1" of the enable signal ts_en in this case.

In the example depicted in FIG. 14, the data value of the capture signal catch_1, which is output from the activation circuit 11-1, becomes "1" during the waiting period P1. Namely, the read command wr_1 is output from the communication interface 3-1 during the waiting period P1. In this case, the control circuit 30 outputs the digital data ts_data, which is obtained by AD conversion, to the register 12-2 as the capture data data_2 and to the register 12-1 as the capture data data_1.

In addition, when a period of eight clock cycles of the sampling clock signal ts_clk has elapsed in the AD conversion period P2, the control circuit 30 sets the data values of the enable signal ts_en and the AD conversion command xTCONV to "0" and outputs the capture reset signal catch_rst in synchronization with the falling edge of the sampling clock signal ts_clk. Thus, the data value of the capture signal catch_1 is reset to "0".

In the example depicted in FIG. 15, the data value of the activation signal tkick_1, which is output from the activation circuit 11-1, becomes "1" at the same time as the data value of the activation signal tkick_2, which is output from the activation circuit 11-2, becomes "1". In this case, the control circuit 30 outputs the digital data ts_data, which is obtained by AD conversion, to the register 12-2 as the capture data data_2 and to the register 12-1 as the capture data data_1.

FIG. 16 depicts destinations to which the digital data ts_data is output in the example operations depicted in FIGS. 8 to 15. As depicted in FIG. 16, at a point when the data value of the activation signal tkick_1, which is output from the activation circuit 11-1, becomes "1", the control circuit 30 sets the communication device 10-1 as the destination to which the digital data ts_data is output. Further, if the data value of the capture signal catch_2, which is output from the activation circuit 11-2, becomes "1" during the waiting period P1 for the AD conversion circuit 20, the waiting period P1 starting immediately after the data value of the activation signal tkick_1, which is output from the activation circuit 11-1, becomes "1", the control circuit 30 sets the communication device 10-2 as the destination to which the digital data ts_data is output.

As depicted in FIG. 16, at a point when the data value of the activation signal tkick_2, which is output from the activation circuit 11-2, becomes "1", the control circuit 30 sets the communication device 10-2 as the destination to which the digital data ts_data is output. Further, if the data value of the capture signal catch_1, which is output from the activation circuit 11-1, becomes "1" during the waiting period P1 for the AD conversion circuit 20, the waiting period P1 starting immediately after the data value of the activation signal tkick_2, which is output from the activation circuit 11-2, becomes "1", the control circuit 30 sets the communication device 10-1 as the destination to which the digital data ts_data is output.

In the example depicted in FIG. 15, the data value of the activation signal tkick_1, which is output from the activation circuit 11-1, becomes "1" at the same time as the data value of the activation signal tkick_2, which is output from the activation circuit 11-2, becomes "1". As depicted in FIG. 16, if the data value of the activation signal tkick_2, which is output from the activation circuit 11-2, becomes "1" at the same time as the data value of the activation signal tkick_1, which is output from the activation circuit 11-1, becomes "1", the control circuit 30 outputs the digital data ts_data, which is obtained by AD conversion, to the register 12-1 as the capture data data_1 and to the register 12-2 as the capture data data_2.

In the configuration according to the present embodiment, as described above, since the two communication devices 10-1 and 10-2 share the use of the AD conversion circuit 20, the circuit scale and power consumption of the communication apparatus 100 can be reduced. Specifically, the two communication devices 10-1 and 10-2 share the use of the AD conversion circuit 20 in the present embodiment in contrast to a configuration in which an analog circuit and an AD conversion circuit are disposed for each communication device (namely, a configuration that includes a plurality of analog circuits, a plurality of AD conversion circuits, and a plurality of communication devices). Reducing the number of AD conversion circuits can reduce the circuit area. In addition, reducing the number of AD conversion circuits can also reduce the power consumed by a plurality of AD conversion circuits.

Further, the time required to read the digital data ts_data can be reduced. Specifically, not only the use of an AD conversion circuit is shared but also a control circuit that reads digital data in response to read-request signals received from a plurality of communication devices is provided in this embodiment. Simply sharing the use of an AD conversion circuit still makes a communication device start operating after another communication device has finished operating. As a result, the operation period for the AD conversion circuit increases approximately in proportion to the number of communication devices. In contrast, in the embodiment according to the present disclosure, since the control circuit 30 performs the control described above, the operation period for the AD conversion circuit 20 is reduced.

Although the two communication devices 10-1 and 10-2 share the use of the AD conversion circuit 20 in the examples described in the above embodiment, three or more communication devices can share the use of the AD conversion circuit 20.

Second Embodiment

Figure 17:
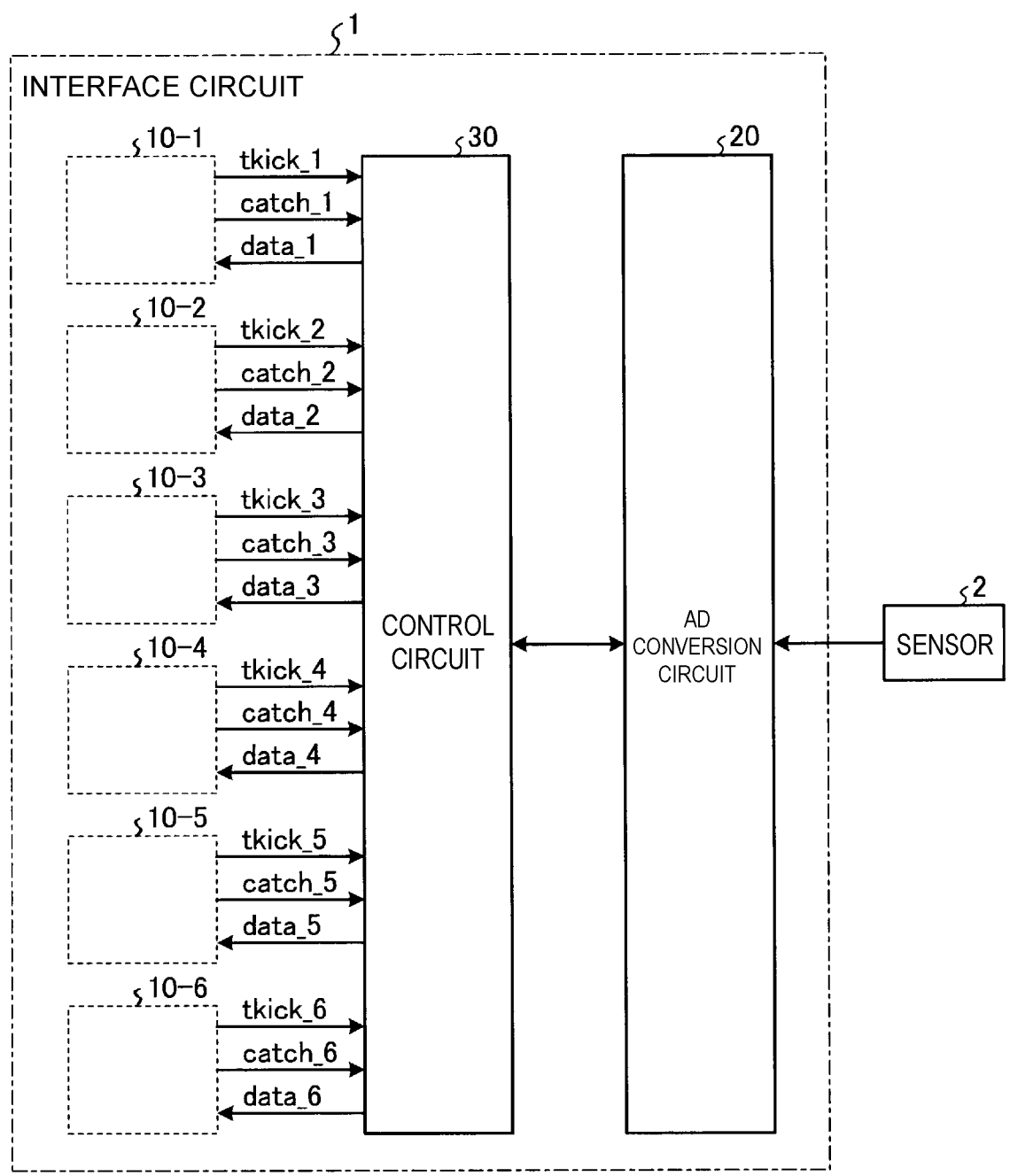
FIG. 17 depicts an example configuration in which six communication devices share the use of an AD conversion circuit.

FIG. 17 depicts an example configuration in which six communication devices share the use of the AD conversion circuit 20. FIG. 18 depicts example destinations to which the digital data ts_data is output in the example configuration depicted in FIG. 17.

In the example configuration depicted in FIG. 17, as depicted in EXAMPLE 1 in FIG. 18, if an activation signal tkick_1 is output from a communication device 10-1 and afterward a capture signal catch_5 is output from a communication device 10-5 during the waiting period P1, the control circuit 30 sets the communication device 10-1 and the communication device 10-5 as destinations to which the digital data ts_data is output.

In the example configuration depicted in FIG. 17, as depicted in EXAMPLE 2 in FIG. 18, if an activation signal tkick_4 is output from a communication device 10-4 and afterward a capture signal catch_1 is output from the communication device 10-1 and a capture signal catch_6 is output from a communication device 10-6 during the waiting period P1, the control circuit 30 sets the communication device 10-1, the communication device 10-4, and the communication device 10-6 as destinations to which the digital data ts_data is output.

In the example configuration depicted in FIG. 17, as depicted in EXAMPLE 3 in FIG. 18, if an activation signal tkick_2 is output from a communication device 10-2 and afterward a capture signal catch_3 is output from a communication device 10-3 and the capture signal catch_5 is output from the communication device 10-5 during the waiting period P1, the control circuit 30 sets the communication device 10-2, the communication device 10-3, and the communication device 10-5 as destinations to which the digital data ts_data is output.

In the example configuration depicted in FIG. 17, as depicted in EXAMPLE 4 in FIG. 18, if an activation signal tkick 5 is output from the communication device 10-5, and afterward the capture signal catch_1 is output from the communication device 10-1, a capture signal catch_2 is output from the communication device 10-2, and the capture signal catch_6 is output from the communication device 10-6 during the waiting period P1, the control circuit 30 sets the communication device 10-1, the communication device 10-2, the communication device 10-5, and the communication device 10-6 as destinations to which the digital data ts_data is output.

In the example configuration depicted in FIG. 17, as depicted in EXAMPLE 5 in FIG. 18, if an activation signal tkick 3 and an activation signal tkick 6 are output at the same time from the communication device 10-3 and the communication device 10-6, respectively, the control circuit 30 sets the communication device 10-3 and the communication device 10-6 as destinations to which the digital data ts_data is output.

In this way, the plurality of communication devices 10 can share the use of the AD conversion circuit 20 of the interface circuit 1 according to this embodiment. Consequently, the circuit scale and power consumption of the communication apparatus 100 can be reduced. Further, the time required to read data can be reduced.

SUMMARIZATION

The embodiments described above are provided for easy understanding of the present disclosure and are not provided with the intention of limiting the present disclosure. Modifications and improvements can be made to the present disclosure without necessarily departing from the spirit of the present disclosure, and the equivalents thereof are also encompassed by the present disclosure.

The following configurations are feasible as described above or instead of the configurations described above.

(1) An interface circuit according to an aspect of the present disclosure includes a plurality of communication devices, an AD conversion circuit that converts an analog signal to digital data, and a control circuit that reads the digital data in response to read-request signals received from the plurality of communication devices.

In a configuration that includes an AD conversion circuit for each of a plurality of communication devices, current consumption increases approximately in proportion to the number of a plurality of AD conversion circuits. In the present configuration, the plurality of communication devices share the use of the AD conversion circuit. Accordingly, the circuit scale and power consumption of the interface circuit can be reduced in the present configuration compared with a configuration that includes an AD conversion circuit for each of a plurality of communication devices.

(2) In the interface circuit described in (1), if the control circuit receives a read-request signal from a first communication device of the plurality of communication devices, the control circuit outputs the digital data to the first communication device, and if the control circuit receives a read-request signal from a second communication device that differs from the first communication device, the control circuit outputs the digital data to the second communication device.

In this configuration, the plurality of communication devices can share the use of the AD conversion circuit.

(3) In the interface circuit described in (1), the AD conversion circuit requires a waiting period during which the AD conversion circuit is configured to not read the digital data after the control circuit receives a read-request signal from a first communication device of the plurality of communication devices, and if the control circuit receives a read-request signal from a second communication device that differs from the first communication device during the waiting period, the control circuit outputs the digital data to the second communication device, and the control circuit is configured to output the digital data to the first communication device.

Simply sharing the use of an AD conversion circuit still makes a communication device start operating after another communication device has finished operating. As a result, the operation period for the AD conversion circuit increases approximately in proportion to the number of communication devices. The interface circuit in the present configuration performs the above process and thus can reduce the time required to read data.

(4) In the interface circuit described in (1), each of the plurality of communication devices includes a communication interface that outputs a read command to read the digital data and an activation circuit that generates in response to the read command, as the read-request signal, an activation signal to activate the AD conversion circuit or a capture signal to capture the digital data. The plurality of communication devices include a first communication device and a second communication device that differs from the first communication device. The AD conversion circuit requires a waiting period after an activation circuit of the first communication device outputs the activation signal, and if an activation circuit of the second communication device receives during the waiting period the read command that is output from a communication interface of the second communication device, the activation circuit of the second communication device outputs the capture signal.

In this configuration, the digital data is output at the same time to both of the communication device that has output the activation signal and the communication device that has output the capture signal during the waiting period. Consequently, the time required to read data can be reduced. In addition, the circuit scale of each of the activation circuits can also be reduced.

(5) A communication apparatus according to an aspect of the present disclosure includes any one of the interface circuits described in (1) to (4), a power amplifier circuit that amplifies a radio frequency signal, and a sensor that detects a temperature of the power amplifier circuit and that outputs the detected value as the analog signal.

In an interface circuit having a configuration that includes an AD conversion circuit for each of a plurality of communication devices, current consumption increases approximately in proportion to the number of a plurality of AD conversion circuits. The circuit scale and power consumption of an interface circuit can be reduced in the present configuration, which adopts an interface circuit in which a plurality of communication devices share the use of an AD conversion circuit, compared with a configuration that includes an AD conversion circuit for each of a plurality of communication devices. Consequently, the circuit scale and power consumption of a communication apparatus can be reduced. Simply sharing the use of an AD conversion circuit still makes a communication device start operating after another communication device has finished operating. As a result, the operation period for the AD conversion circuit increases approximately in proportion to the number of communication devices. The interface circuit in the present configuration performs the above process and thus can reduce the time required to read data.

According to this disclosure, the circuit scale and power consumption can be reduced, and the time required to read data can also be reduced.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A communication apparatus comprising:
    an interface circuit comprising:
        a plurality of communication devices;
        an analog-to-digital (AD) conversion circuit configured to convert an analog signal to digital data;
        a control circuit configured to read and output the digital data in response to read-request signals received from the plurality of communication devices;
    a power amplifier circuit configured to amplify a radio frequency signal; and
    a sensor configured to detect a temperature of the power amplifier circuit and to output the detected temperature as the analog signal.

2. The communication apparatus according to claim 1, wherein:
    when the control circuit receives a read-request signal from a first of the plurality of communication devices, the control circuit is configured to output the digital data to the first communication device, and
    when the control circuit receives a read-request signal from a second of the plurality of communication devices, the control circuit is configured to output the digital data to the second communication device.

3. An interface circuit comprising:
    a plurality of communication devices;
    an analog-to-digital (AD) conversion circuit configured to convert an analog signal to digital data; and
    a control circuit configured to read and output the digital data in response to read-request signals received from the plurality of communication devices, wherein:
    after the control circuit receives a read-request signal from a first of the plurality of communication devices, the AD conversion circuit is configured to not read the digital data during a waiting period, and
    when the control circuit receives a read-request signal from a second of the plurality of communication devices during the waiting period, the control circuit is configured to output the digital data to the second communication device, and the control circuit is configured to output the digital data to the first communication device.

4. A communication apparatus comprising:
    the interface circuit according to claim 3;
    a power amplifier circuit configured to amplify a radio frequency signal; and
    a sensor configured to detect a temperature of the power amplifier circuit and to output the detected temperature as the analog signal.

5. An interface circuit comprising:
    a plurality of communication devices;
    an analog-to-digital (AD) conversion circuit configured to convert an analog signal to digital data; and
    a control circuit configured to read and output the digital data in response to read-request signals received from the plurality of communication devices,
    wherein each of the plurality of communication devices comprises:
        a communication interface configured to output a read command; and
        an activation circuit configured to, in response to the read command received from the communication interface, generate an activation signal or a capture signal as the read-request signal, the activation signal being configured to activate the AD conversion circuit and the capture signal being configured cause the control circuit to capture the digital data,
    wherein after the activation circuit of the first communication device outputs the activation signal, the AD conversion circuit is configured to not read the digital data during a waiting period, and
    wherein when, during the waiting period, the activation circuit of a second of the plurality of communication devices receives the read command from the communication interface of the second communication device, the activation circuit of the second communication device is configured to output the capture signal.

6. A communication apparatus comprising:
    the interface circuit according to claim 5;
    a power amplifier circuit configured to amplify a radio frequency signal; and
    a sensor configured to detect a temperature of the power amplifier circuit and to output the detected temperature as the analog signal.

* * * * *

UNITED STATES PATENT AND TRADEMARK OFFICE
CERTIFICATE OF CORRECTION

PATENT NO. : 11,070,239 B2
APPLICATION NO. : 16/711685
DATED : July 20, 2021
INVENTOR(S) : Toshiki Matsumura et al.

Page 1 of 1

It is certified that error appears in the above-identified patent and that said Letters Patent is hereby corrected as shown below:

In the Specification

Column 3, Line 28, "1" should be -- $\underline{1}$ --.

Column 3, Line 29, "2" should be -- $\underline{2}$ --.

Signed and Sealed this
Twelfth Day of April, 2022

Drew Hirshfeld
*Performing the Functions and Duties of the*
*Under Secretary of Commerce for Intellectual Property and*
*Director of the United States Patent and Trademark Office*